(12) United States Patent
Seo

(10) Patent No.: US 11,062,783 B2
(45) Date of Patent: Jul. 13, 2021

(54) MEMORY DEVICE

(71) Applicant: SK hynix Inc., Icheon-si (KR)

(72) Inventor: Moon Sik Seo, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/657,253

(22) Filed: Oct. 18, 2019

(65) Prior Publication Data

US 2021/0027848 A1    Jan. 28, 2021

(30) Foreign Application Priority Data

Jul. 23, 2019 (KR) .................. 10-2019-0089123

(51) Int. Cl.
| | |
|---|---|
| *G11C 16/04* | (2006.01) |
| *G11C 16/34* | (2006.01) |
| *G11C 16/26* | (2006.01) |
| *G11C 16/32* | (2006.01) |
| *G11C 16/24* | (2006.01) |
| *G11C 16/08* | (2006.01) |

(52) U.S. Cl.
CPC .......... *G11C 16/3427* (2013.01); *G11C 16/08* (2013.01); *G11C 16/24* (2013.01); *G11C 16/26* (2013.01); *G11C 16/32* (2013.01)

(58) Field of Classification Search
CPC ..... G11C 16/3427; G11C 16/08; G11C 16/24; G11C 16/26; G11C 16/32
See application file for complete search history.

(56) References Cited

U.S. PATENT DOCUMENTS

| | | | | |
|---|---|---|---|---|
| 8,923,061 B2* | 12/2014 | Kim | ................... | G11C 16/0483 |
| | | | | 365/185.18 |
| 9,281,058 B2* | 3/2016 | Lee | ........................ | G11C 16/24 |
| 9,633,732 B2* | 4/2017 | Lee | ........................ | G11C 16/24 |
| 9,704,587 B1* | 7/2017 | Park | ................... | G11C 16/0483 |

FOREIGN PATENT DOCUMENTS

| | | |
|---|---|---|
| KR | 101109316 B1 | 2/2012 |
| KR | 1020140088384 A | 7/2014 |

* cited by examiner

*Primary Examiner* — Pho M Luu
(74) *Attorney, Agent, or Firm* — William Park & Associates Ltd.

(57) ABSTRACT

A memory device includes a memory cell array having a plurality of memory strings and includes a voltage generating circuit configured to generate and apply a plurality of drain select line voltages, a plurality of source select line voltages, and a read voltage to the memory cell array during a read operation. The memory device also includes control logic configured to control the voltage generating circuit to generate a first drain select line voltage applied to a first unselected memory string among unselected memory strings among the plurality of memory strings and a second drain select line voltage applied to second unselected memory strings among the unselected memory strings during the read operation, wherein the second drain select line voltage is different from the first drain select line voltage.

18 Claims, 12 Drawing Sheets

MEMORY DEVICE

CROSS-REFERENCE TO RELATED APPLICATION

The present application claims priority under 35 U.S.C. § 119(a) to Korean patent application number 10-2019-0089123, filed on Jul. 23, 2019, in the Korean Intellectual Property Office, the entire disclosure of which is incorporated herein by reference.

BACKGROUND

1. Technical Field

Various embodiments generally relate to an electronic device, and more particularly, to a memory device.

2. Related Art

Semiconductor devices, in particular, memory devices, may be classified into volatile memory devices and nonvolatile memory devices.

A nonvolatile memory device may have comparatively low write and read speeds, but may retain stored data in the absence of supplied power. Therefore, the nonvolatile memory device may be used when there is the need for storing data which should be retained regardless of a supply of power. Examples of nonvolatile memory devices include Read Only Memory (ROM), Mask ROM (MROM), Programmable ROM (PROM), Erasable Programmable ROM (EPROM), Electrically Erasable Programmable ROM (EEPROM), flash memory, Phase-change Random Access Memory (PRAM), Magnetic RAM (MRAM), Resistive RAM (RRAM), and Ferroelectric RAM (FRAM). Flash memory may be classified into NOR-type memory and NAND-type memory.

Among these nonvolatile memory devices, flash memory may have both advantages of RAM, in which data is freely programmable and erasable, and advantages of ROM, in which data stored therein can be retained even without power. Flash memory has been widely used as storage media for portable electronic devices such as digital cameras, Personal Digital Assistants (PDAs), and MP3 players.

Flash memory devices may be classified into two-dimensional semiconductor devices, in which memory strings are horizontally formed on a semiconductor substrate, and three-dimensional semiconductor devices, in which memory strings are vertically formed on a semiconductor substrate.

Three-dimensional semiconductor devices are designed to overcome integration limits of two-dimensional semiconductor devices and include a plurality of memory strings vertically formed on a semiconductor substrate. Each of the memory strings may include a drain select transistor, memory cells, and a source select transistor coupled in series between a bit line and a source line.

SUMMARY

Various embodiments are directed to a memory device capable of improving a disturb phenomenon of an unselected memory string during a read operation.

According to an embodiment, a memory device may include a memory cell array having a plurality of memory strings and includes a voltage generating circuit configured to generate and apply a plurality of drain select line voltages, a plurality of source select line voltages, and a read voltage to the memory cell array during a read operation. The memory device also includes control logic configured to control the voltage generating circuit to generate a first drain select line voltage applied to a first unselected memory string among unselected memory strings among the plurality of memory strings and a second drain select line voltage applied to second unselected memory strings among the unselected memory strings during the read operation, wherein the second drain select line voltage is different from the first drain select line voltage.

According to an embodiment, a memory device may include a memory cell array having a plurality of memory strings and include a voltage generating circuit configured to generate and apply a plurality of drain select line voltages, a plurality of source select line voltages, and a read voltage to the memory cell array during a read operation. The memory device may also include a control logic configured to control the voltage generating circuit to apply, during the read operation, a first drain select line voltage applied to a first unselected memory string among unselected memory strings among the plurality of memory strings at a first potential level and a second drain select line voltage applied to second unselected memory strings among the unselected memory strings at a second potential level lower than the first potential level.

According to an embodiment, a memory device may include a memory cell array having a plurality of memory strings and include a voltage generating circuit configured to generate and apply a plurality of drain select line voltages, a plurality of source select line voltages, and a read voltage to the memory cell array during a read operation. The memory device may also include control logic configured to control the voltage generating circuit to apply, during the read operation, a first drain select line voltage applied to a first unselected memory string among unselected memory strings among the plurality of memory strings during a first period and a second drain select line voltage applied to second unselected memory strings among the unselected memory strings during a second time period shorter than the first time period.

DETAILED DESCRIPTION

Figure 1:
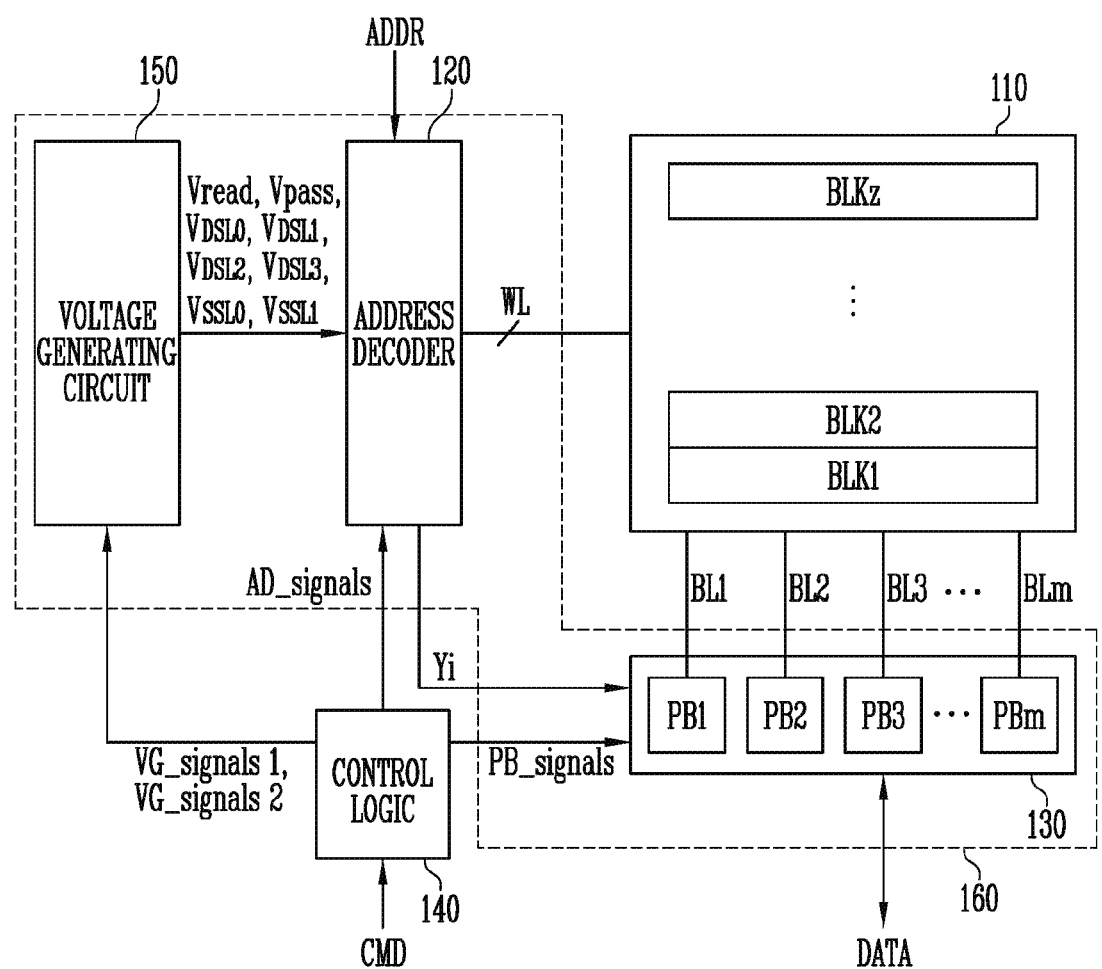
FIG. 1 is a block diagram illustrating a memory device according to an embodiment.

Hereinafter, specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various modifications and changes may be applied to the examples of embodiments in accordance with the concepts so that the examples of embodiments will be illustrated in the drawings and described in the specification. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components should not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include plural forms as well, unless the context clearly indicates otherwise. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in this specification, should not be construed as having idealistic or overly formal meanings.

In some embodiments, well-known processes, device structures, and technologies will not be described in detail to avoid ambiguousness of the present teachings. This intends to disclose the gist of the present disclosure more clearly by omitting unnecessary description.

Hereinafter, embodiments will be described in detail with reference to the accompanying drawings in order for those skilled in the art to be able to readily implement the technical spirit of the present disclosure.

FIG. 1 is a block diagram illustrating a memory device 100 according to an embodiment.

Referring to FIG. 1, the memory device 100 may include a memory cell array 110, an address decoder 120, a read and write circuit 130, control logic 140, and a voltage generating circuit 150. The address decoder 120, the read and write circuit 130, and the voltage generating circuit 150 may be defined as a peripheral circuit 160 configured to perform a read operation on the memory cell array 110.

The memory cell array 110 may include a plurality of memory blocks BLK1 to BLKz. The plurality of memory blocks BLK1 to BLKz may be coupled to the address decoder 120 through word lines WLs. The plurality of memory blocks BLK1 to BLKz may be coupled to the read and write circuit 130 through bit lines BL1 to BLm. Each of the plurality of memory blocks BLK1 to BLKz may include a plurality of memory cells. According to an embodiment, the plurality of memory cells may be nonvolatile memory cells. Memory cells coupled to the same word line among the plurality of memory cells may be defined as one page. In other words, the memory cell array 110 may include a plurality of pages.

Each of the plurality of memory blocks BLK1 to BLKz of the memory cell array 110 may include a plurality of memory strings. Each of the plurality of memory strings may include a drain select transistor, a plurality of memory cells, and a source select transistor coupled in series between a bit line and a source line. In addition, each of the plurality of memory strings may include pass transistors between a source select transistor and memory cells and between a drain select transistor and memory cells, respectively, and may further include a pipe gate transistor between memory cells. The memory cell array 110 will be described in detail below.

The address decoder 120 may be coupled to the memory cell array 110 through the word lines WLs. The address decoder 120 may be configured to operate in response to address decoder control signals AD_signals generated in the control logic 140. The address decoder 120 may receive an address ADDR through an input/output buffer (not illustrated) in the memory device 100.

The address decoder 120 may decode a row address among the received address ADDR and apply a plurality of operating voltages including a read voltage Vread, a pass voltage Vpass, a plurality of drain select line voltages $V_{DSL0}$, $V_{DSL1}$, $V_{DSL2}$, and $V_{DSL3}$, and a plurality of source select line voltages $V_{SSL0}$ and $V_{SSL1}$ generated in the voltage generating circuit 150 to the plurality of memory cells, the drain select transistors, and the source select transistors of the memory cell array 110 according to the decoded row address during the read operation.

The address decoder 120 may be configured to decode a column address among the received address ADDR during the read operation. The address decoder 120 may transfer the decoded column address Yi to the read and write circuit 130.

The address ADDR received during the read operation may include a block address, a row address, and a column address. The address decoder 120 may select one memory block and one word line according to the block address and the row address. The column address may be decoded by the address decoder 120 and provided to the read and write circuit 130.

The address decoder 120 may include a block decoder, a row decoder, a column decoder, and an address buffer.

The read and write circuit 130 may include a plurality of page buffers PB1 to PBm. The plurality of page buffers PB1 to PBm may be coupled to the memory cell array 110 through the bit lines BL1 to BLm. Each of the plurality of page buffers PB1 to PBm may perform a read operation by precharging the bit lines BL1 to BLm to a set level during a precharge operation of the read operation and by sensing a potential level or an amount of current of the bit lines BL1 to BLm during a read voltage apply operation.

The read and write circuit 130 may operate in response to page buffer control signals PB_signals output from the control logic 140.

According to an embodiment, the read and write circuit 130 may include page buffers (or page registers), a column select circuit, or the like.

The control logic 140 may be implemented as hardware, software, or a combination of hardware and software. For example, the control logic 140 may be a control logic circuit operating in accordance with an algorithm and/or a processor executing control logic code. The control logic 140 may be coupled to the address decoder 120, the read and write circuit 130, and the voltage generating circuit 150. The control logic 140 may receive a command CMD through the input/output buffer (not illustrated) of the memory device 100. The control logic 140 may be configured to control the general operations of the memory device 100 in response to the command CMD. For example, the control logic 140 may receive the command CMD corresponding to the read operation, generate and output the address decoder control signals AD_signals to control the address decoder 120, the page buffer control signals PB_signals to control the read and write circuit 130, and voltage generating circuit control signals VG_signals 1 and VG_signals 2 to control the voltage generating circuit 150 in response to the received command CMD.

The control logic 140 according to an embodiment may control a voltage applied to a drain select transistor of an unselected memory string which shares a source select line with a selected memory string and a voltage applied to a drain select transistor of an unselected memory string which does not share a source select line with a selected memory string such that these voltages are different from each other during the read operation. Accordingly, a disturb phenomenon caused by Hot Carrier Injection (HCI) during a read operation may be prevented by adjusting a channel potential level of unselected memory strings.

The voltage generating circuit 150 may generate and output the read voltage Vread, the pass voltage Vpass, the plurality of drain select line voltages $V_{DSL0}$, $V_{DSL1}$, $V_{DSL2}$, and $V_{DSL3}$, and the plurality of source select line voltages $V_{SSL0}$ and $V_{SSL1}$ to the address decoder 120 in response to the control of the voltage generating circuit control signals VG_signals 1 and VG_signals 2 output from the control logic 140 during the read operation.

Figure 2:
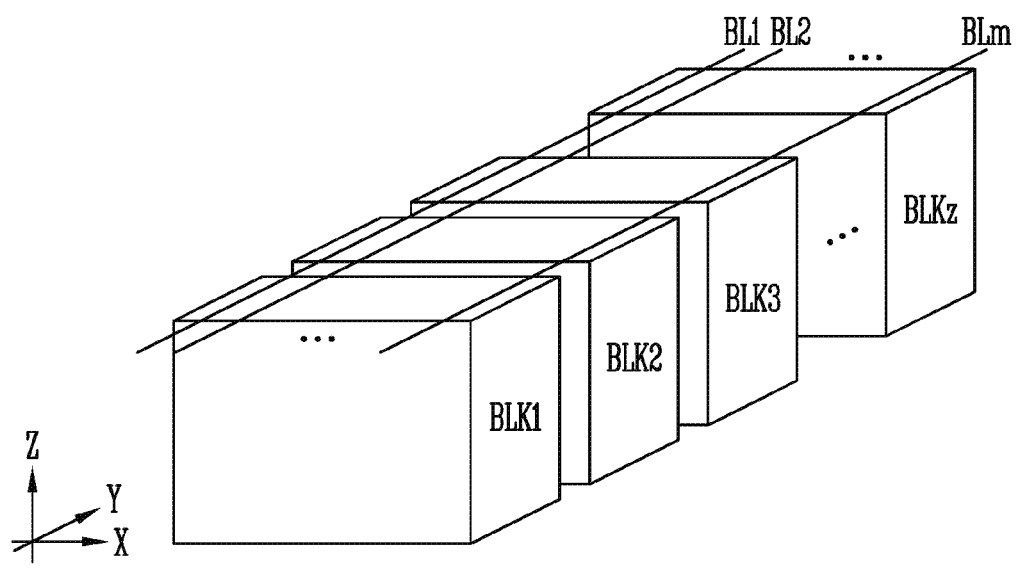
FIG. 2 is a diagram illustrating three-dimensionally structured memory blocks.

FIG. 2 is a diagram illustrating three-dimensionally structured memory blocks.

Referring to FIG. 2, the three-dimensionally structured memory blocks BLK1 to BLKz may be arranged to be spaced apart from each other in a direction Y in which the bit lines BL1 to BLm extend. For example, the first to z memory blocks BLK1 to BLKz may be arranged to be spaced apart from each other in the second direction Y and may include a plurality of memory cells stacked in a third direction Z. The configuration of one of the first to z memory blocks BLK1 to BLKz will be described later in detail with reference to FIGS. 3, 4, and 5.

Figure 3:
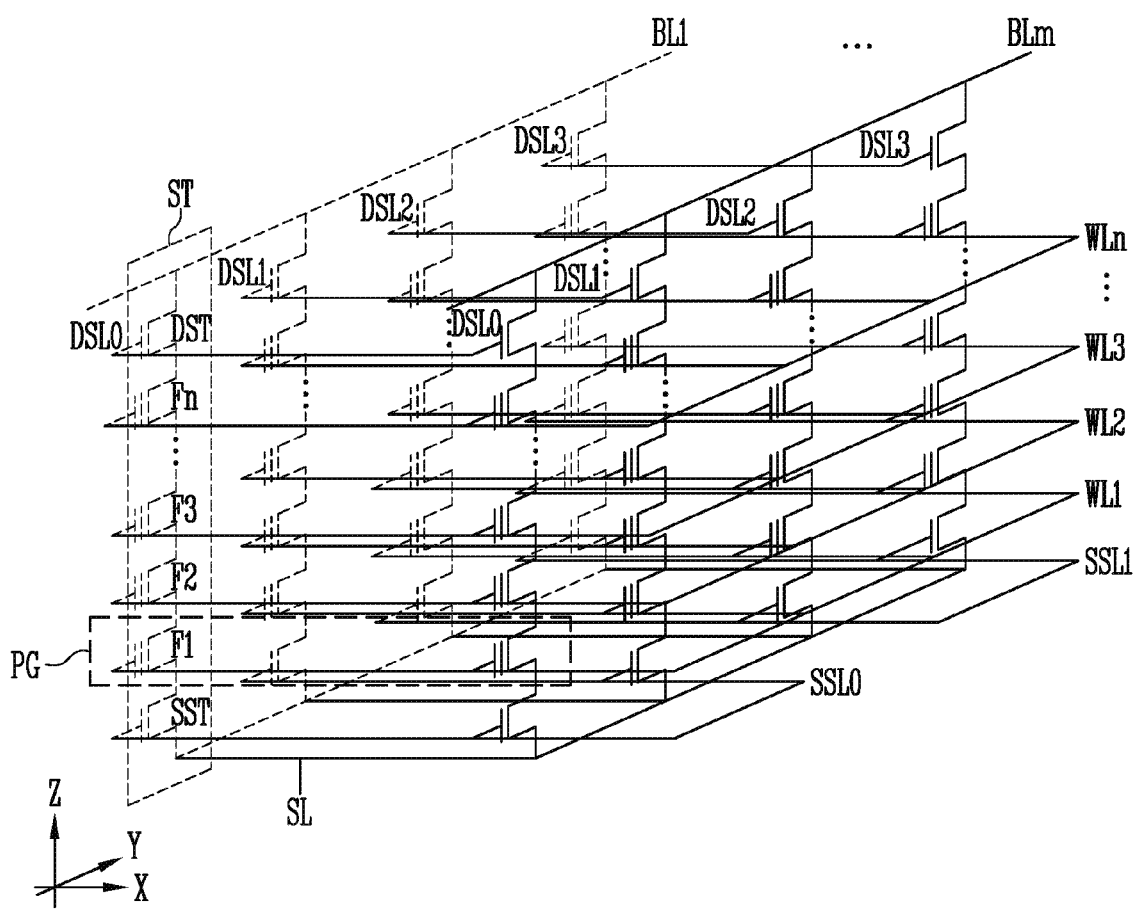
FIG. 3 is a circuit diagram illustrating one of the memory blocks shown in FIG. 2 in detail.

FIG. 3 is a circuit diagram illustrating one of the memory blocks shown in FIG. 2 in detail.

Figure 4:
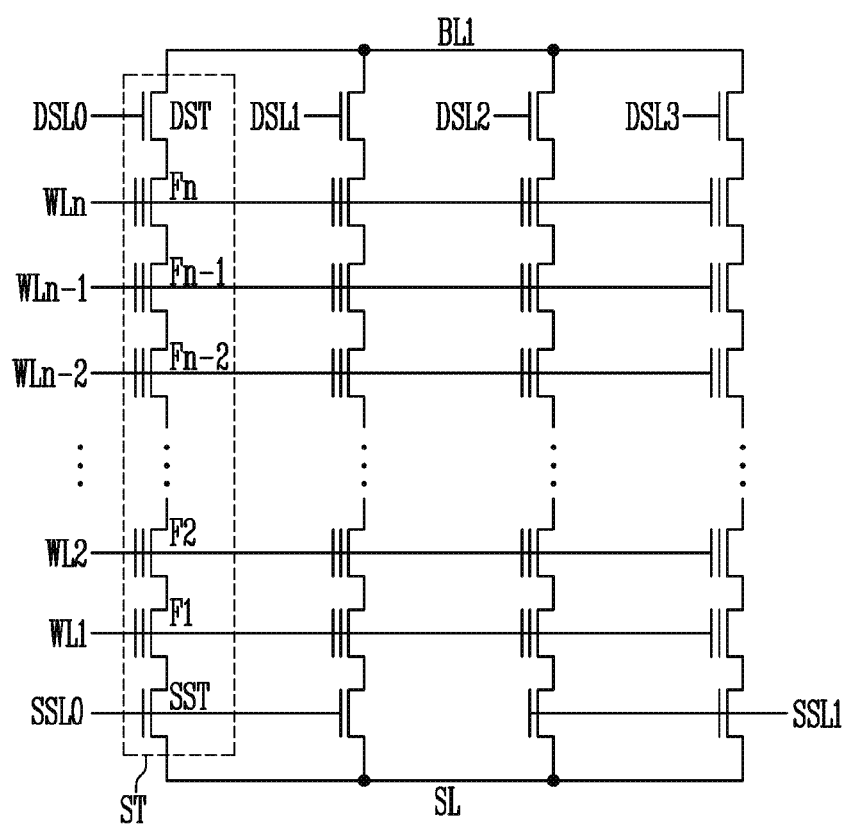
FIG. 4 is a circuit diagram illustrating memory strings shown in FIG. 3.

FIG. 4 is a circuit diagram illustrating the memory strings shown in FIG. 3.

Referring to FIGS. 3 and 4, respective memory strings ST may be coupled between the bit lines BL1 to BLm and a source line SL. The memory string ST coupled between the first bit line BL1 and the source line SL will be described below as an example.

The memory string ST may include a source select transistor SST, memory cells F1 to Fn, and a drain select transistor DST coupled in series between the source line SL and the first bit line BL1, where n is a positive integer. Gates of the source select transistors SST included in different memory strings ST coupled to different bit lines BL1 to BLm may be coupled to a first source select line SSL0 and a second source select line SSL1. For example, source select transistors adjacent to each other in the second direction Y among the source select transistors SST may be coupled to the same source select line. For example, on the assumption that the source select transistors SST are sequentially arranged, gates of the source select transistors SST arranged in a first direction X from the first source select transistor SST and included in different strings ST and gates of the source select transistors SST arranged in the first direction X from the second source select transistor SST and included in different strings ST may be coupled to the first source select line SSL0. In addition, gates of the source select transistors SST arranged in the first direction X from the third source select transistor SST and included in different strings ST and gates of the source select transistors SST arranged in the first direction X from the fourth source select transistor SST and included in different strings ST may be coupled to the second source select line SSL1.

Gates of the memory cells F1 to Fn may be coupled to word lines WL1 to WLn and gates of the drain select transistors DST may be coupled to one of first, second, third, and fourth drain select lines DSL0, DSL1, DSL2, and DSL3.

Gates of transistors arranged in the first direction X among the drain select transistors DST may be coupled to the same drain select line (for example, DSL0) in common, but gates of transistors arranged in the second direction Y among the drain select transistors DST may be coupled to the different drain select lines DSL1, DSL2, and DSL3. For example, on the assumption that the drain select transistors DST are sequentially arranged in the second direction Y, gates of the drain select transistors DST arranged in the first direction X from the first drain select transistor DST and included in different strings ST may be coupled to the first drain select line DSL0. The drain select transistors DST arranged in the second direction Y from the drain select transistors DST coupled to the first drain select line DSL0 may be sequentially coupled to the second, third, and fourth drain select lines DSL1, DSL2, and DSL3. Accordingly, the memory strings ST coupled to a selected drain select line may be selected and the memory strings ST coupled to remaining unselected drain select lines might not be selected in the selected memory block.

Memory cells coupled to the same word line may form a page PG. The page PG may refer to a physical page. For example, a group of memory cells coupled to the same word line in the first direction X among the strings ST coupled to the first bit line BL1 to the mth bit line BLm may refer to the page PG. For example, memory cells arranged in the first direction X among the first memory cells F1 coupled to the first word line WL1 may form one page PG. Memory cells arranged in the second direction Y among the first memory cells F1 coupled to the first word line WL1 in common may define different pages. Accordingly, when the first drain select line DSL0 is a selected drain select line and the first word line WL1 is a selected word line, a page coupled to the first drain select line DSL0 among the plurality of pages PG coupled to the first word line WL1 may be a selected page. Pages coupled to the first word line WL1 in common, but coupled to the unselected second, third, and fourth drain select lines DSL1, DSL2, and DSL3 may be unselected pages.

In FIGS. 3 and 4, it is illustrated that one source select transistor SST and one drain select transistor DST are included in one string ST. However, a plurality of source select transistors SST and the plurality of drain select transistors DST may be included in one string ST depending on a memory device. In addition, dummy cells may be further included between the source select transistor SST, the memory cells F1 to Fn, and the drain select transistor DST depending on a memory device. Dummy cells might not store user data unlike general memory cells F1 to Fn but may be used to improve electrical characteristics of each string ST.

Figure 5:
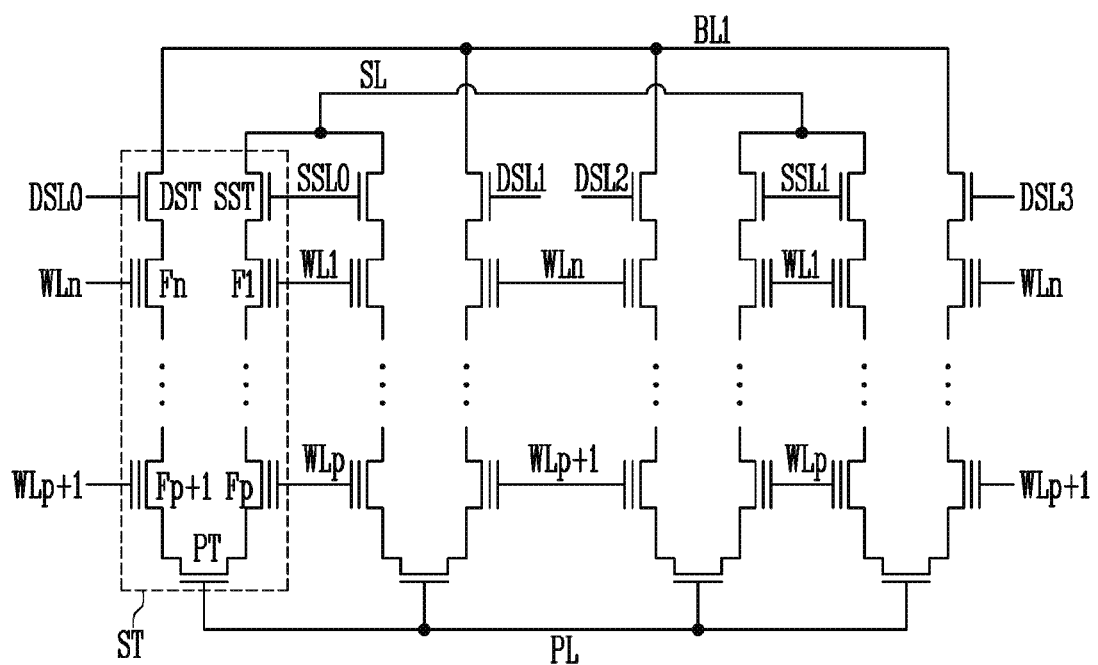
FIG. 5 is a circuit diagram illustrating memory strings according to another embodiment.

FIG. 5 is a circuit diagram illustrating memory strings according to another embodiment.

Referring to FIG. 5, a plurality of memory strings ST may be coupled between one bit line (for example, BL1) and the source line SL, and each of the memory strings ST may have a 'U' shape.

Each of the plurality of memory strings ST may include at least one source select transistor SST, first to nth memory cells F1 to Fn, a pipe transistor PT, and at least one drain select transistor DST. The pipe transistor PT may be coupled between the pth memory cell Fp and the (p+1)th memory cell Fp+1 and a gate of the pipe transistor PT may be coupled to a pipe line PL. The first to pth memory cells F1 to Fp and the (p+1)th to nth memory cells Fp+1 to Fn may be coupled to each other through the pipe transistor PT.

Figure 6:
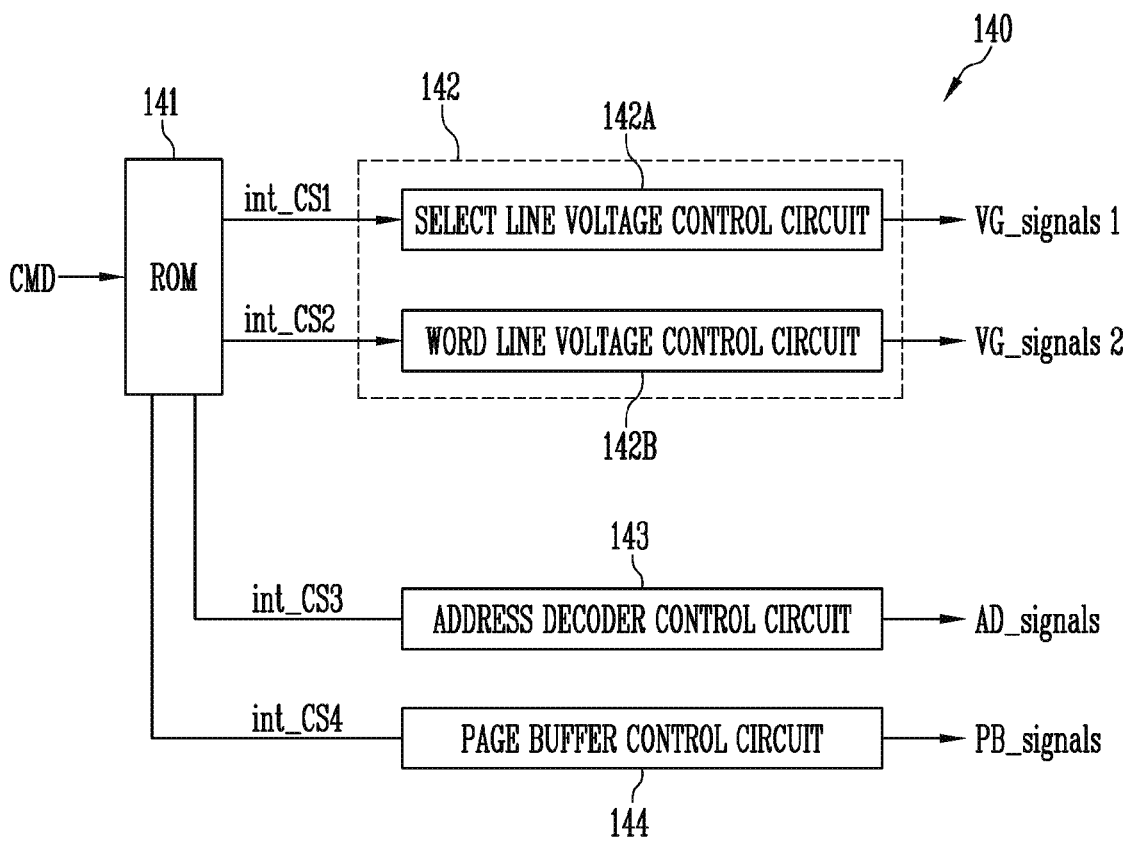
FIG. 6 is a diagram illustrating control logic of FIG. 1.

The structure of the memory strings illustrated in FIG. 5 corresponds to the structure of the memory strings illustrated in FIG. 4 to which the pipe transistor PT is further included. FIG. 6 is a diagram illustrating the control logic 140 of FIG. 1.

Referring to FIG. 6, the control logic 140 may include ROM 141, a voltage generation control circuit 142, an address decoder control circuit 143, and a page buffer control circuit 144.

The ROM 141 may store an algorithm to perform general operations of a memory device and generate a plurality of internal control signals int_CS1, int_CS2, int_CS3, and int_CS4 in response to the command CMD input from an external device, for example, a host coupled to the memory device.

The voltage generation control circuit 142 may include a select line voltage control circuit 142A and a word line voltage control circuit 142B. The select line voltage control circuit 142A may generate the first voltage generating circuit control signals VG_signals 1 to control the voltage generating circuit 150 shown in FIG. 1 to generate the select line voltages $V_{DSL0}$, $V_{DSL1}$, $V_{DSL2}$, $V_{DSL3}$, $V_{SSL0}$, and $V_{SSL1}$ applied to a selected memory block during a read operation of the memory device in response to the internal control signal int_CS1. The word line voltage control circuit 142B may generate the second voltage generating circuit control signals VG_signals 2 to control the voltage generating circuit 150 shown in FIG. 1 to generate the read voltage Vread and the pass voltage Vpass applied to a selected memory block during the read operation of the memory device in response to the internal control signal int_CS2.

The address decoder control circuit 143 may output the address decoder control signals AD_signals to control the address decoder 120 of FIG. 1 during the general operations of the memory device in response to the internal control signal int_CS3.

The page buffer control circuit 144 may output the page buffer control signals PB_signals to control the read and write circuit 130 of FIG. 1 during the general operations of the memory device in response to the internal control signal int_CS4.

Figure 7:
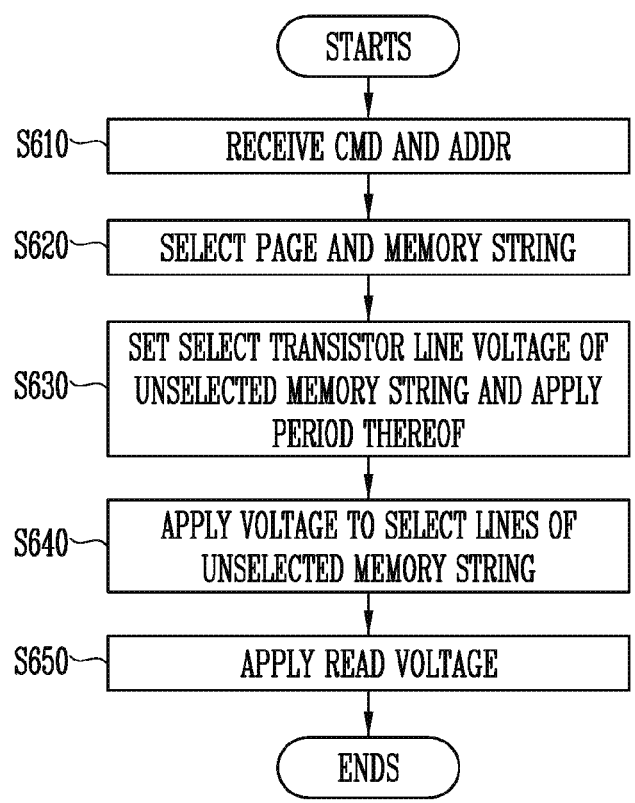
FIG. 7 is a flowchart illustrating a read operation of a memory device according to an embodiment.

FIG. 7 is a flowchart illustrating a read operation of a memory device according to an embodiment.

A read operation of a memory device according to an embodiment is described below with reference to FIGS. 1 to 7.

The memory device 100 may receive (S610), from an external device, the command CMD corresponding to the read operation and the address ADDR corresponding to the memory cells to be read.

The memory device 100 may select (S620) one of the plurality of memory blocks 110, e.g., BLK1 to BLKz, included in the memory cell array 110 in response to the received command CMD and address ADDR, and select a page and memory strings to perform the read operation of the selected memory block (for example, BLK1).

According to an embodiment, for convenience of explanation, a case will be described where the memory strings ST coupled to the first drain select line DSL0 among each of the bit lines BL1 to BLm shown in FIG. 3 are selected and the page PG corresponding to the word line WL3 among the plurality of pages PG is selected.

The memory device 100 may set (S630) the plurality of drain select line voltages $V_{DSL1}$, $V_{DSL2}$, and $V_{DSL3}$ applied to the unselected memory strings during the read operation and set a time period during which the voltages are applied. The memory device may set the drain select line voltage (for example, $V_{DSL1}$) of the unselected memory string which shares the source select line with the selected memory string among the plurality of unselected memory strings to be different from the drain select line voltages (for example, $V_{DSL2}$ and $V_{DSL3}$) of the remaining unselected memory strings. For example, the drain select line voltage (for example, $V_{DSL1}$) of the unselected memory string which shares the source select line with the selected memory string may be set to a voltage to turn on the drain select transistor DST, that is, a turn-on voltage. The drain select line voltages (for example, $V_{DSL2}$ and $V_{DSL3}$) of the remaining unselected memory strings may be set to a ground voltage Vss or a voltage lower than a threshold voltage of the drain select transistor DST. In addition, the drain select line voltages (for example, $V_{DSL2}$ and $V_{DSL3}$) of the remaining unselected memory strings may be set to the turn-on voltage such that the turn-on voltage is applied during a first time period, and the drain select line voltage (for example, $V_{DSL1}$) of the unselected memory string may be set to the turn-on voltage such that the turn-on voltage is applied during a second time period longer than the first time period. The drain select line voltage applied to the unselected memory string which shares the source select line with the selected memory string and the drain select line voltages applied to the remaining unselected memory strings will be described in detail below with reference to FIGS. 8 to 11.

Information regarding a potential level of the turn-on voltage applied to the drain select line of the unselected memory strings described above and a time period during which the turn-on voltage is applied may be stored in the ROM 141 of the control logic 140.

The control logic 140 may control the peripheral circuit 160 to perform a read operation in response to the received command CMD.

First, the ROM 141 of the control logic 140 may output the plurality of internal control signals int_CS1, int_CS2, int_CS3, and int_CS4 in response to the command CMD.

The voltage generation control circuit 142 may output the first voltage generating circuit control signals VG_signals 1 and the second voltage generating circuit control signals VG_signals 2 in response to the internal control signals int_CS1 and int_CS2. The voltage generating circuit 150 may generate the drain select line voltage $V_{DSL0}$ applied to the first drain select line DSL0 corresponding to the selected memory string and the drain select line voltages VDSL1, VDSL2, and VDSL3 applied to the second, third, and fourth drain select lines DSL1, DSL2, and DSL3 corresponding to the unselected memory strings in response to the first voltage generating circuit control signals VG_signals 1. In addition, the voltage generating circuit 150 may generate the source select line voltage $V_{SSL0}$ applied to the first source select line SSL0 corresponding to the selected memory string and the source select line voltage $V_{SSL1}$ applied to the second source select line SSL1 corresponding to the unselected memory strings in response to the first voltage generating circuit control signals VG_signals 1.

The address decoder control circuit 143 may output the address decoder control signals AD_signals in response to the internal control signal int_CS3. The address decoder 120 may apply the drain select line voltages $V_{DSL0}$, $V_{DSL1}$, $V_{DSL2}$, and $V_{DSL3}$ to the first, second, third, and fourth drain select lines DSL0, DSL1, DSL2, and DSL3 of the selected memory block BLK1 and may apply the source select line voltages $V_{SSL0}$ and $V_{SSL1}$ to the first and second source select lines SSL0 and SSL1 in response to the address decoder control signals AD_signals and the address ADDR (S640).

The drain select line voltage $V_{DSL1}$ having the turn-on voltage may be applied to the unselected memory string which shares the source select line SSL0 with the selected memory string to turn on the drain select transistor DST.

The voltage generating circuit 150 may generate the read voltage Vread and the pass voltage Vpass applied to the word lines WL of the selected memory block BLK1 in response to the second voltage generating circuit control signals VG_signals 2.

The address decoder control circuit 143 may output the address decoder control signals AD_signals in response to the internal control signal int_CS3. The address decoder 120 may apply the pass voltage Vpass to the unselected word lines (for example, WL1, WL2, and WL4 to WLn) of the selected memory block BLK1 in response to the address decoder control signals AD_signals and the address ADDR. Because the drain select line voltage $V_{DSL1}$ having the turn-on voltage is applied to the unselected memory string which shares the source select line SSL0 with the selected memory string and the drain select transistor DST is turned on, a local boosting phenomenon might not occur in a channel of the memory cells F4 to Fn even when the pass voltage Vpass is applied to the unselected word lines WL4 to WLn. Accordingly, because the local boosting phenomenon of the unselected memory string which shares the first source select line SSL0 with the selected memory string is prevented, a disturb phenomenon caused by Hot Carrier Injection (HCI) may be improved.

Subsequently, the address decoder 120 may apply (S650) the read voltage Vread to the selected word line WL3 in response to the address decoder control signals AD_signals and the address ADDR. Subsequently, the page buffer control circuit 144 may output the page buffer control signals PB_signals in response to the internal control signal int_CS4 and the read and write circuit 130 may sense a potential level or a current level of the bit lines BL1 to BLm of the selected memory block BLK1 and perform a read operation in response to the page buffer control signals PB_signals.

Read data DATA sensed by the read and write circuit 130 may be output to an external device.

Figure 8:
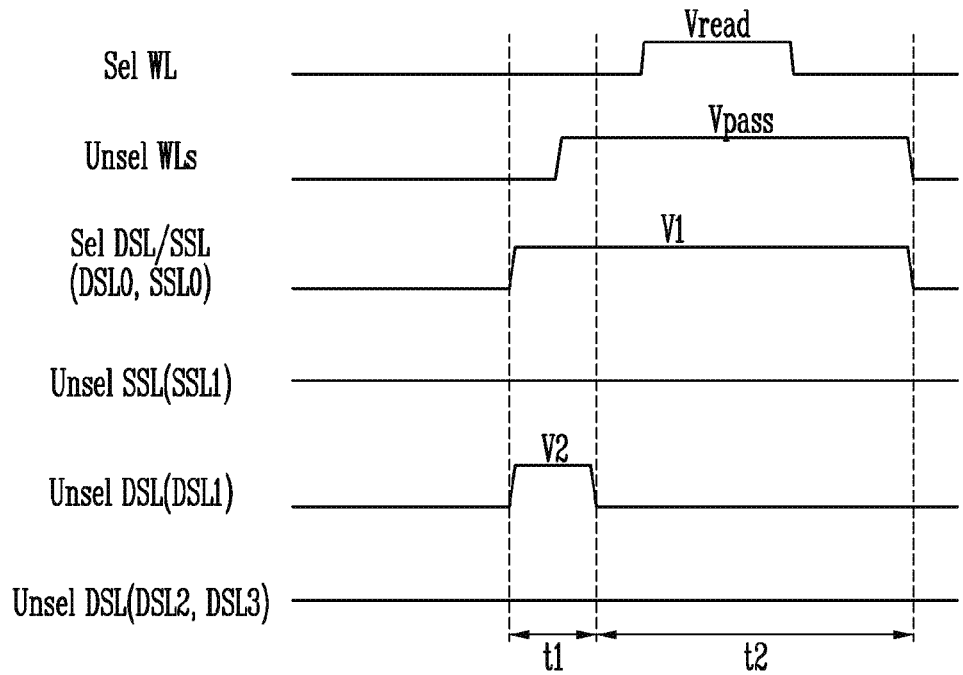
FIG. 8 is a waveform diagram of signals illustrating a method of performing a read operation of a memory device according to a first embodiment.

FIG. 8 is a waveform diagram of signals illustrating a method of performing a read operation of a memory device according to a first embodiment.

The method of performing a read operation of a memory device according to the first embodiment is described below with reference to FIGS. 3 to 8.

First, a first voltage V1 may be applied to the first drain select line DSL0 and the first source select line SSL0 corresponding to a selected memory string ST. The first voltage V1 may be a voltage to turn on the drain select transistor DST and the source select transistor SST. In addition, a second voltage V2 may be applied to the second drain select line DSL1 corresponding to the unselected memory string which shares the first source select line SSL0 with the selected memory string during a first time period t1. For an embodiment, the second voltage V2 may have the same potential level as the first voltage V1. Accordingly, the source select transistor SST and the drain select transistor DST included in the unselected memory string which shares the first source select line SSL0 with the selected memory string may be turned on.

Subsequently, the pass voltage Vpass may be applied to unselected word lines Unsel WLs. Even when the pass voltage Vpass is applied to the unselected memory string which shares the first source select line SSL0 with the selected memory string, because the source select transistor SST and the drain select transistor DST are turned on, a local boosting phenomenon might not occur in a channel of the pass voltage Vpass of the unselected memory string which shares the first source select line SSL0 with the selected memory string. Accordingly, a disturb phenomenon caused by Hot Carrier Injection (HCI) may be improved.

Subsequently, the read voltage Vread may be applied to a selected word line Sel WL during a second time period t2.

Figure 9:
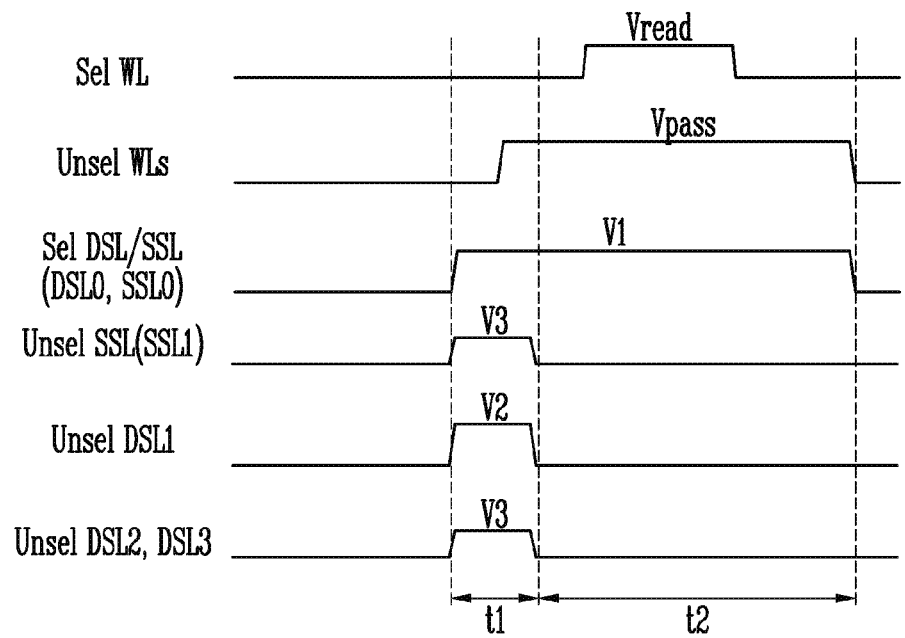
FIG. 9 is a waveform diagram of signals illustrating a method of performing a read operation of a memory device according to a second embodiment.

FIG. 9 is a waveform diagram of signals illustrating a method of performing a read operation of a memory device according to a second embodiment.

The method of performing a read operation of a memory device according to the second embodiment is described below with reference to FIGS. 3 to 9.

First, the first voltage V1 may be applied to the first drain select line DSL0 and the first source select line SSL0 corresponding to the selected memory string ST. The first voltage V1 may be a voltage to turn on the drain select transistor DST and the source select transistor SST. In addition, the second voltage V2 may be applied to the second drain select line DSL1 corresponding to the unselected memory string which shares the first source select line SSL0 with the selected memory string during the first time period t1. For an embodiment, the second voltage V2 may have the same potential level as the first voltage V1. Accordingly, the source select transistor SST and the drain select transistor DST included in the unselected memory string which shares the first source select line SSL0 with the selected memory string may be turned on. In addition, a third voltage V3 may be applied to the second source select line SSL1, the third drain select line DSL2, and the fourth drain select line DSL3 corresponding to the remaining unselected memory strings. The third voltage V3 may be lower than the second voltage V2. The third voltage V3 may be lower than a threshold voltage of each of the source select transistor SST and the drain select transistor DST. Accordingly, the drain select transistor DST and the source select transistor SST of the remaining unselected memory strings might not be turned on. However, a leakage current may be incurred by the third voltage V3.

Subsequently, the pass voltage Vpass may be applied to the unselected word lines Unsel WLs. Even when the pass voltage Vpass is applied to the unselected memory string which shares the first source select line SSL0 with the selected memory string, because the source select transistor SST and the drain select transistor DST are turned on, a local boosting phenomenon might not occur in a channel of the pass voltage Vpass of the unselected memory string which shares the first source select line SSL0 with the selected memory string. Accordingly, a disturb phenomenon caused by Hot Carrier Injection (HCI) may be improved. In addition, a leakage current may occur from the drain select transistor DST and the source select transistor SST of the remaining unselected memory strings, such that a potential level of a channel of the remaining unselected memory strings may be decreased. Accordingly, a disturb phenomenon of the remaining unselected memory strings caused by Hot Carrier Injection (HCI) may be improved.

Subsequently, the read voltage Vread may be applied to the selected word line Sel WL during the second time period t2.

Figure 10:
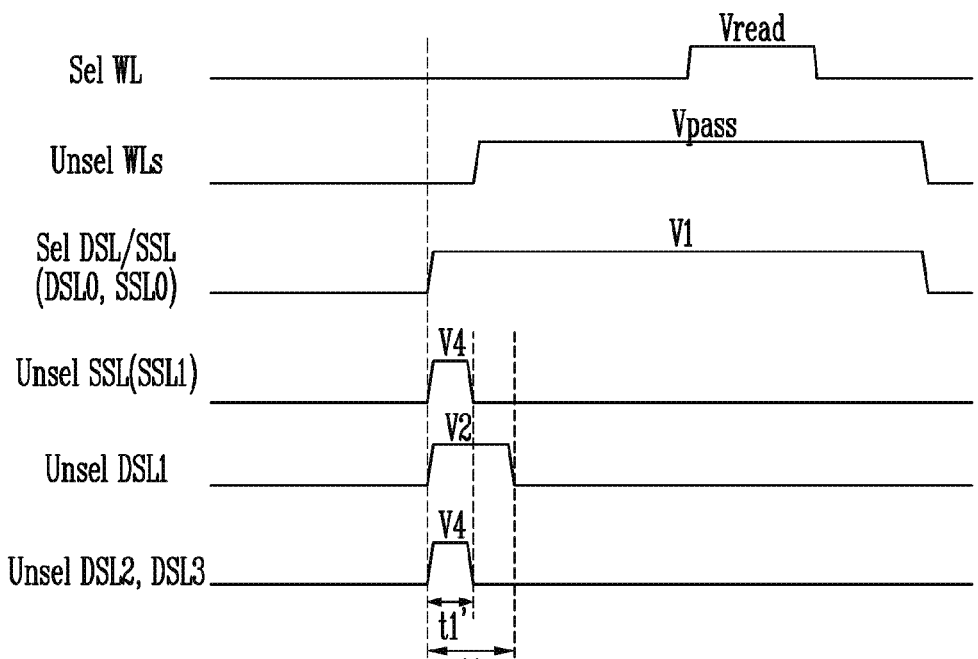
FIG. 10 is a waveform diagram of signals illustrating a method of performing a read operation of a memory device according to a third embodiment.

FIG. 10 is a waveform diagram of signals illustrating a method of performing a read operation of a memory device according to a third embodiment.

The method of performing a read operation of a memory device according to the third embodiment is described below with reference to FIGS. 3 to 10.

First, the first voltage V1 may be applied to the first drain select line DSL0 and the first source select line SSL0 corresponding to the selected memory string ST. The first voltage V1 may be a voltage to turn on the drain select transistor DST and the source select transistor SST. In addition, the second voltage V2 may be applied to the second drain select line DSL1 corresponding to the unselected memory string which shares the first source select line SSL0 with the selected memory string during the first time period t1. For an embodiment, the second voltage V2 may have the same potential level as the first voltage V1. Accordingly, the source select transistor SST and the drain select transistor DST included in the unselected memory string which shares the first source select line SSL0 with the selected memory string may be turned on. In addition, a fourth voltage V4 may be applied to the second source select line SSL1, the third drain select line DSL2 and the fourth drain select line DSL3 corresponding to the remaining unselected memory strings. The fourth voltage V4 may be applied during a shorter time period t1' than the time period t1 during which the second voltage V2 is applied. The fourth voltage V4 may have a potential level the same as or lower than the second voltage V2. Accordingly, the drain select transistor DST and the source select transistor SST of the remaining unselected memory strings may be turned on during a time period shorter than a time period during which the drain select transistor DST and the source select transistor SST of the unselected memory string which shares the source select line with the selected memory string, or a leakage current may occur.

Subsequently, the pass voltage Vpass may be applied to the unselected word lines Unsel WLs. Even when the pass voltage Vpass is applied to the unselected memory string which shares the first source select line SSL0 with the selected memory string, because the source select transistor SST and the drain select transistor DST are turned on, a local boosting phenomenon might not occur in a channel of the pass voltage Vpass of the unselected memory string which shares the first source select line SSL0 with the selected memory string. Accordingly, a disturb phenomenon caused by Hot Carrier Injection (HCI) may be improved. In addition, the drain select transistor DST and the source select transistor SST of the remaining unselected memory strings may be turned on during the shorter time period t1' than the time period t1 or a leakage current may occur, such that a potential level of a channel of the remaining unselected memory strings may be decreased. Accordingly, a disturb phenomenon of the remaining unselected memory strings caused by Hot Carrier Injection (HCI) may be improved.

Subsequently, the read voltage Vread may be applied to the selected word line Sel WL.

Figure 11:
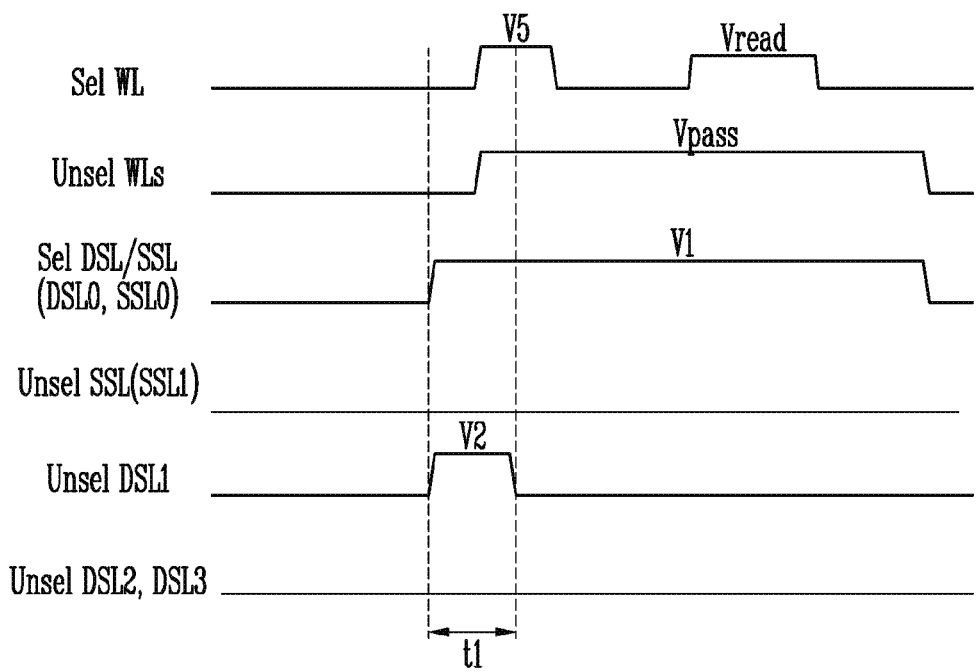
FIG. 11 is a waveform diagram of signals illustrating a method of performing a read operation of a memory device according to a fourth embodiment.

FIG. 11 is a waveform diagram of signals illustrating a method of performing a read operation of a memory device according to a fourth embodiment.

The method of performing a read operation of a memory device according to the fourth embodiment is described below with reference to FIGS. 3 to 11.

First, the first voltage V1 may be applied to the first drain select line DSL0 and the first source select line SSL0 corresponding to the selected memory string ST. The first voltage V1 may be a voltage to turn on the drain select transistor DST and the source select transistor SST. In addition, the second voltage V2 may be applied to the second drain select line DSL1 corresponding to the unselected memory string which shares the first source select line SSL0 with the selected memory string during the first time period t1. For an embodiment, the second voltage V2 may have the same potential level as the first voltage V1. Accordingly, the source select transistor SST and the drain select transistor DST included in the unselected memory string which shares the first source select line SSL0 with the selected memory string may be turned on.

Subsequently, the pass voltage Vpass may be applied to the unselected word lines Unsel WLs. A fifth voltage V5 may be applied to the selected word line Sel WL during a predetermined time period. For an embodiment, the fifth voltage V5 may have the same potential level as the pass voltage Vpass. Accordingly, hot carriers which may be present in a channel of the unselected memory string which shares the source select line SSL0 with the selected memory string may be removed through the bit line BL1 and the source line SL. Accordingly, a disturb phenomenon caused by Hot Carrier Injection (HCI) may be improved.

Subsequently, the read voltage Vread may be applied to the selected word line Sel WL.

The fourth embodiment as stated above may correspond to the first embodiment to which removing the hot carriers in the channel by applying the fifth voltage V5 to the selected word line Sel WL is added. The fourth embodiment may also be applied to the second embodiment and the third embodiment described above. In other words, the hot carriers in the channel of the memory strings may be removed by applying the fifth voltage V5 to the selected word line Sel WL in a state where the third voltage V3 is applied to the second source select line SSL1, the third drain select line DSL2, and the fourth drain select line DSL3 corresponding to the remaining unselected memory strings in the second embodiment. In addition, the hot carriers in the channel of the memory strings may be removed by applying the fifth voltage V5 to the selected word line Sel WL in a state where the fourth voltage V4 is applied to the second source select line SSL1, the third drain select line DSL2, and the fourth drain select line DSL3 corresponding to the remaining unselected memory strings in the third embodiment.

Figure 12:
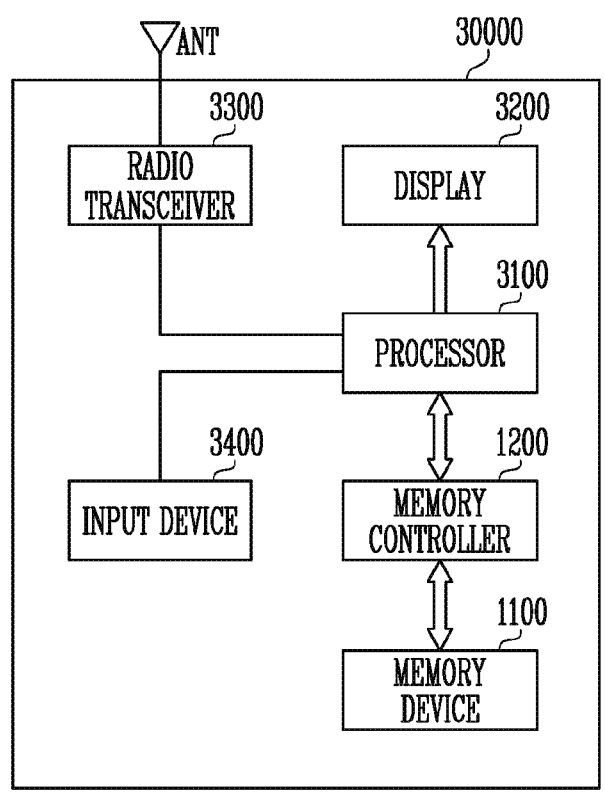
FIG. 12 is a diagram illustrating a memory system including the memory device of FIG. 1.

FIG. 12 is a diagram illustrating a memory system 30000 including the memory device of FIG. 1.

Referring to FIG. 12, the memory system 30000 may be embodied into a cellular phone, a smartphone, a tablet PC, a personal digital assistant (PDA), or a wireless communication device. The memory system 30000 may include a memory device 1100 and a memory controller 1200 controlling the operations of the memory device 1100. The memory controller 1200 may control a data access operation of the memory device 1100, for example, a program operation, an erase operation, or a read operation in response to control of a processor 3100.

The memory controller 1200 may control data programmed into the memory device 1100 to be output through a display 3200 in response to control of the memory controller 1200. The memory device 1100 may be configured and operated in the same manner as the memory device 100 shown in FIG. 1.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the memory controller 1200 or the display 3200. The memory controller 1200 may program the signal processed by the processor 3100 into the memory device 1100. In addition, the radio transceiver 3300 may change a signal output from the processor 3100 to a radio signal and output the radio signal to an external device through the antenna ANT. A control signal for controlling the operations of the processor 3100 or data to be processed by the processor 3100 may be input by an input device 3400, and the input device 3400 may include a pointing device, such as a touch pad and a computer mouse, a keypad, or a keyboard. The processor 3100 may control the operations of the display 3200 so that data output from the memory controller 1200, data output from the radio transceiver 3300, or data output from the input device 3400 may be output through the display 3200.

According to an embodiment, the memory controller 1200 controlling the operations of the memory device 1100 may be part of the processor 3100, or be formed as a separate chip from the processor 3100.

Figure 13:
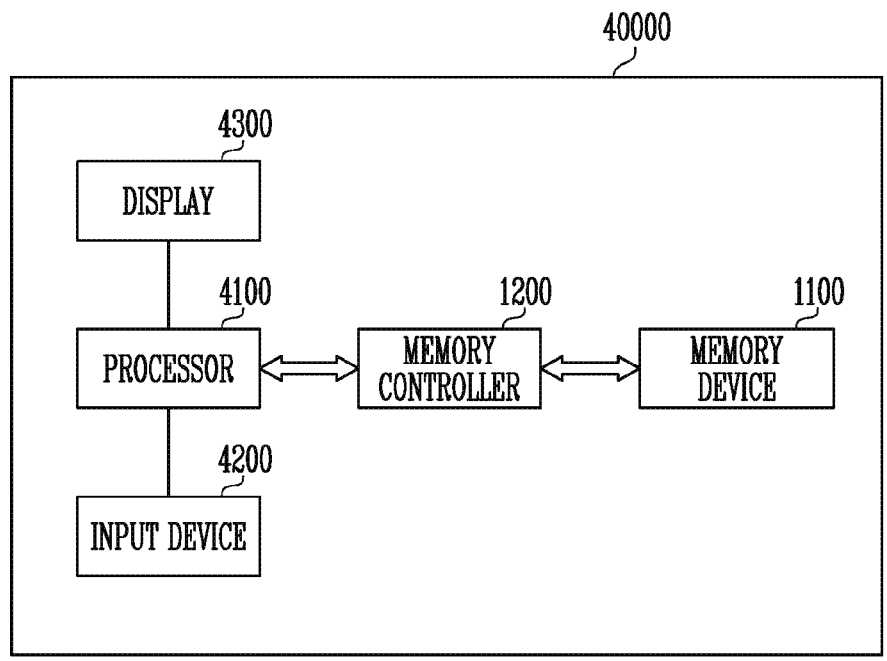
FIG. 13 is a diagram illustrating another embodiment of a memory system.

FIG. 13 is a diagram illustrating another embodiment of a memory system 40000.

Referring to FIG. 13, the memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100. The memory device 1100 may be configured and operated in the same manner as the memory device 100 shown in FIG. 1.

A processor 4100 may output data stored in the memory device 1100 through a display 4300 according to data input through an input device 4200. Examples of the input device 4200 may include a pointing device such as a touch pad or a computer mouse, a keypad, or a keyboard.

The processor 4100 may control the general operations of the memory system 40000 and control the operations of the memory controller 1200. According to an embodiment, the memory controller 1200 controlling the operations of the memory device 1100 may be part of the processor 4100, or be formed as a separate chip from the processor 4100.

Figure 14:
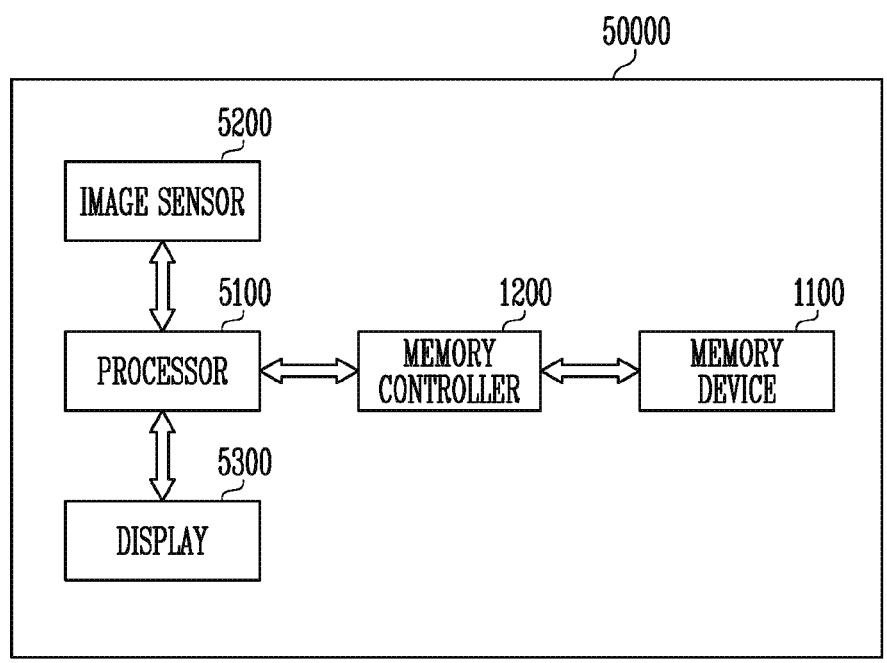
FIG. 14 is a diagram illustrating another embodiment of a memory system.

FIG. 14 is a diagram illustrating another embodiment of a memory system 50000.

Referring to FIG. 14, the memory system 50000 may be embodied into an image processor, for example, a digital camera, a cellular phone with a digital camera attached thereto, a smartphone with a digital camera attached thereto, or a tablet PC with a digital camera attached thereto.

The memory system 50000 may include the memory device 1100 and the memory controller 1200 controlling a data processing operation of the memory device 1100, for example, a program operation, an erase operation, or a read operation. The memory device 1100 may be configured and operated in the same manner as the memory device 100 shown in FIG. 1.

An image sensor 5200 of the memory system 50000 may convert an optical image into digital signals, and the digital signals may be transferred to a processor 5100 or the memory controller 1200. In response to control of the processor 5100, the digital signals may be output through a display 5300 or stored in the memory device 1100 through the memory controller 1200. In addition, the data stored in the memory device 1100 may be output through the display 5300 according to control of the processor 5100 or the memory controller 1200.

According to an embodiment, the memory controller 1200 controlling the operations of the memory device 1100 may be part of the processor 5100, or be formed as a separate chip from the processor 5100.

Figure 15:
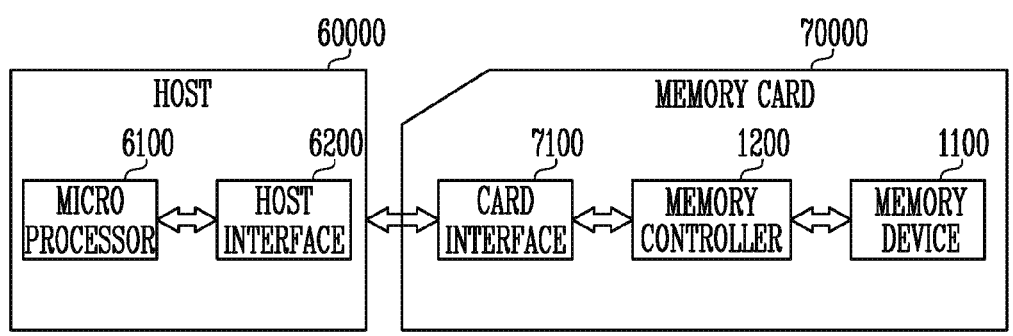
FIG. 15 is a diagram illustrating another embodiment of a memory system.

FIG. 15 is a diagram illustrating another embodiment of a memory system 70000.

Referring to FIG. 15, the memory system 70000 may include a memory card or a smart card. The memory system 70000 may include the memory device 1100, the memory controller 1200, and a card interface 7100. The memory device 1100 may be configured and operated in the same manner as the memory device 100 shown in FIG. 1.

The memory controller 1200 may control data exchange between the memory device 1100 and the card interface 7100. According to an embodiment, the card interface 7100 may be, but is not limited to, a secure digital (SD) card interface or a multi-media card (MMC) interface.

The card interface 7100 may interface data exchange between a host 60000 and the memory controller 1200 according to a protocol of the host 60000. According to an embodiment, the card interface 7100 may support a Universal Serial Bus (USB) protocol and an InterChip (IC)-USB protocol. The card interface may refer to hardware capable of supporting a protocol which is used by the host 60000, software installed in the hardware, or a signal transmission method.

When the memory system 70000 is connected to an host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 in response to control of a microprocessor 6100.

As described above, according to the present disclosure, a read disturb phenomenon may be improved by adjusting an initial turn-on time period of select transistors of unselected memory strings during a read operation of a memory device.

It will be apparent to those skilled in the art that various modifications can be made to the above-described embodiments of the present teachings without departing from the spirit or scope of the present teachings. Thus, it is intended that the present teachings cover all such modifications provided they come within the scope of the appended claims and their equivalents.

As described above, although the present teachings are described with the limited embodiments and drawings, the present teachings are not limited to the above-stated embodiments. It would be possible for those skilled in the art to which the present teachings pertain to make many modifications and variations as still be consistent with the present teachings described above.

In the above-described embodiments, all steps may be selectively performed or skipped. In addition, the steps in each embodiment need not always be performed in regular order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the teachings described herein will still fall within the spirit and scope of the present disclosure as defined in the accompanying claims and equivalents thereof.

What is claimed is:

1. A memory device, comprising:
   a memory cell array including a plurality of memory strings;
   a voltage generating circuit configured to generate and apply a plurality of drain select line voltages, a plurality of source select line voltages, and a read voltage to the memory cell array during a read operation; and
   control logic configured to control the voltage generating circuit to generate a first drain select line voltage applied to a first unselected memory string among unselected memory strings among the plurality of memory strings and a second drain select line voltage applied to second unselected memory strings among the unselected memory strings during the read operation, wherein the second drain select line voltage is different from the first drain select line voltage,
   wherein the voltage generating circuit applies the first drain select line voltage applied to the first unselected memory string at a level of a turn-on voltage during a first time period before applying the read voltage to the memory cell array during the read operation.

2. The memory device of claim 1, wherein the plurality of memory strings included in the memory cell array are coupled between one bit line and a source line, and
   wherein the plurality of memory strings share one source select line per at least two memory strings and the at least two memory strings are coupled to different drain select lines, respectively.

3. The memory device of claim 2, wherein the first unselected memory string shares a source select line with a selected memory string, and
   wherein the second unselected memory strings represent the unselected memory strings with the exception of the first unselected memory string.

4. The memory device of claim 1, wherein the voltage generating circuit applies the turn-on voltage to a drain select line and a source select line of a selected memory string sharing a source select line with the first unselected memory string when the first drain select line voltage having the level of the turn-on voltage is applied to the first unselected memory string.

5. The memory device of claim 1, wherein the voltage generating circuit applies the first drain select line voltage having the level of the turn-on voltage to the first unselected memory string and applies a pass voltage to unselected word lines of the memory cell array.

6. The memory device of claim 1, wherein the voltage generating circuit applies the turn-on voltage to a selected word line during a predetermined time period when a pass voltage is applied to unselected word lines of the memory cell array.

7. The memory device of claim 6, wherein a channel of the first unselected memory string is electrically coupled to a bit line and a source line during a time period in which the first time period and the predetermined time period overlap each other to remove a hot carrier in the channel.

8. A memory device, comprising:
   a memory cell array including a plurality of memory strings;
   a voltage generating circuit configured to generate and apply a plurality of drain select line voltages, a plurality of source select line voltages, and a read voltage to the memory cell array during a read operation; and
   control logic configured to control the voltage generating circuit to apply, during the read operation, a first drain select line voltage applied to a first unselected memory string among unselected memory strings among the plurality of memory strings at a first potential level and a second drain select line voltage applied to second unselected memory strings among the unselected memory strings at a second potential level lower than the first potential level,
   wherein the first potential level is higher than a threshold voltage of select transistors included in the unselected memory strings.

9. The memory device of claim 8, wherein the plurality of memory strings included in the memory cell array are coupled between one bit line and a source line, and
   wherein the plurality of memory strings share one source select line per at least two memory strings, and the at least two memory strings are coupled to different drain select lines, respectively.

10. The memory device of claim 9, wherein the first unselected memory string shares a source select line with a selected memory string, and wherein the second unselected memory strings represent the unselected memory strings with the exception of the first unselected memory string.

11. The memory device of claim 8, wherein the voltage generating circuit applies the first drain select line voltage having the first potential level and the second drain select line voltage having the second potential level to the first unselected memory string and the second unselected memory strings, respectively, during a first time period before applying the read voltage to the memory cell array during the read operation.

12. The memory device of claim 11, wherein the voltage generating circuit applies a turn-on voltage to a selected word line of the memory cell array during a predetermined time period after the first time period starts and before the read voltage is applied to the selected word line.

13. A memory device, comprising:
a memory cell array including a plurality of memory strings;
a voltage generating circuit configured to generate and apply a plurality of drain select line voltages, a plurality of source select line voltages, and a read voltage to the memory cell array during a read operation; and
control logic configured to control the voltage generating circuit to apply, during the read operation, a first drain select line voltage applied to a first unselected memory string among unselected memory strings among the plurality of memory strings during a first time period and a second drain select line voltage applied to second unselected memory strings among the unselected memory strings during a second time period shorter than the first time period,
wherein the voltage generating circuit applies the first drain select line voltage applied to the first unselected memory string at a level of a turn-on voltage during the first time period before applying the read voltage to the memory cell array during the read operation.

14. The memory device of claim 13, wherein the plurality of memory strings included in the memory cell array are coupled between one bit line and a source line, and
wherein the plurality of memory strings share one source select line per at least two memory strings and the at least two memory strings are coupled to different drain select lines, respectively.

15. The memory device of claim 14, wherein the first unselected memory string shares a source select line with a selected memory string, and
wherein the second unselected memory strings represent the unselected memory strings with the exception of the first unselected memory string.

16. The memory device of claim 13, wherein the voltage generating circuit applies the first drain select line voltage to the first unselected memory string and a pass voltage to unselected word lines of the memory cell array.

17. The memory device of claim 16, wherein the voltage generating circuit applies a turn-on voltage to a selected word line of the memory cell array during a predetermined time period before the pass voltage is applied to the unselected word lines and the read voltage is applied to the selected word line.

18. The memory device of claim 13, wherein the second drain select line voltage has a lower level of potential than the first drain select line voltage.

* * * * *